United States Patent
Kihara et al.

(10) Patent No.: US 8,540,001 B2
(45) Date of Patent: Sep. 24, 2013

(54) DIE BONDER AND SEMICONDUCTOR MANUFACTURING METHOD

(75) Inventors: Masamichi Kihara, Kumagaya (JP); Yoshiaki Kishi, Kumagaya (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 0 days.

(21) Appl. No.: 13/044,148

(22) Filed: Mar. 9, 2011

(65) Prior Publication Data

US 2012/0214258 A1    Aug. 23, 2012

(30) Foreign Application Priority Data

Feb. 18, 2011    (JP) .................. 2011-032881

(51) Int. Cl.
  *B32B 37/00*    (2006.01)
(52) U.S. Cl.
  USPC ............ 156/362; 156/378; 156/379; 156/580
(58) Field of Classification Search
  USPC ................ 156/362, 378, 580, 580.1, 580.2, 156/581, 583.1, 379
  See application file for complete search history.

(56) References Cited

U.S. PATENT DOCUMENTS

| | | | |
|---|---|---|---|
| 6,244,493 B1* | 6/2001 | Shimazaki et al. | 228/5.5 |
| 6,605,491 B1* | 8/2003 | Hsieh et al. | 438/118 |
| 2008/0128081 A1* | 6/2008 | Wang et al. | 156/285 |

FOREIGN PATENT DOCUMENTS

| | | |
|---|---|---|
| JP | 2001-203224 A | 7/2001 |
| JP | 2005-235903 | 9/2005 |
| KR | 10-2004-0094900 | 11/2004 |
| KR | 10-2009-0019568 | 2/2009 |

OTHER PUBLICATIONS

Korean Office Action mailed Jun. 1, 2012.
Japanese Patent Office mailed Jan. 8, 2013 (2 pages).

* cited by examiner

*Primary Examiner* — James Sells
(74) *Attorney, Agent, or Firm* — Crowell & Moring LLP

(57) ABSTRACT

The present invention provides a reliable die bonder that can accurately bond a die and a semiconductor manufacturing method. The present invention is provided with a bonding head that adsorbs a die from a wafer and bonds it to a substrate, a positioning mechanism that is provided with a first adjustment mechanism that positions a position of the die at predetermined accuracy, and positions the bonding head, a positioning controller that controls the positioning mechanism and a second adjustment mechanism that is provided to the bonding head, and adjusts a position of the die at higher accuracy than the first adjustment mechanism.

12 Claims, 7 Drawing Sheets

DIE BONDER AND SEMICONDUCTOR MANUFACTURING METHOD

FIELD OF THE INVENTION

The present invention relates to a die bonder and a semiconductor manufacturing method, detailedly relates to a reliable die bonder and a semiconductor manufacturing method.

BACKGROUND OF THE INVENTION

A process in which a die (a semiconductor chip) is mounted on a substrate such as a wiring substrate and a lead frame and a package is assembled includes a die bonding step for picking up a die from a wafer and bonding it to a substrate.

In the die bonding step, the die is required to be accurately bonded to a bonding face of the substrate. However, the face of the substrate is heated at high temperature of approximately 80 to 250° C. to facilitate bonding. The misregistration and others of components are caused by high temperature or radiant heat and as a result, the die cannot be bonded to a precise position.

JP-A No. 2001-203224 is included in the related art for solution to this type of problem. The problem in this application is that the difference (an offset amount) between positions of a camera for detecting a bonding position and a bonding tool varies every moment because of radiant heat from a high-temperature bonding stage. To solve this problem, in this application, the offset amount is detected using a reference member provided in the vicinity of the bonding stage for a reference point and the bonding position is corrected.

SUMMARY OF THE INVENTION

However, for recent positioning accuracy in die bonding, high accuracy of 10 μm is required because of the miniaturization of a die and further, according to the development of three-dimensional packaging technology such as Thought Silicon Via (TSV), the positioning accuracy of die bonding is enhanced up to a few μm. Therefore, the development of technique for enabling high-accuracy positioning is required. Further, in addition to the problem of JP-A No. 2001-203224, the misregistration of bonding on the side of a substrate has been a problem due to the thermal expansion of the substrate, a bonding stage that supports the substrate and others.

The present invention is made in view of the problems and its object is to provide a reliable die bonder that can accurately bond to a die and a semiconductor manufacturing method.

The present invention has at least the following characteristics to achieve the object.

The present invention has a first characteristic that there are provided a bonding head that adsorbs a die from a wafer and bonds it to a substrate, a positioning mechanism that is equipped with a first adjustment mechanism that positions a position of the die at predetermined accuracy, and positions the bonding head, a positioning controller that controls the positioning mechanism and a second adjustment mechanism and a second adjustment mechanism that is provided to the bonding head, and adjusts a position of the die at higher accuracy than the first adjustment mechanism.

Besides, the present invention has a second characteristic that the second adjustment mechanism is provided with an actuator that acts upon a shaft at an end of the bonding head from plural directions and displaces by a predetermined quantity.

Further, the present invention has a third characteristic that the actuator is provided to one of a plane parallel to a die bonding plane and a plane placed at an angle with the bonding plane.

Further, the present invention has a fourth characteristic that the actuator is one of a piezo-electric device and an ultra-magnetostrictive device.

Furthermore, the present invention has a fifth characteristic that there is provided a restoring force means that generates restoring force for restoring the displacement from directions opposite to the plural directions.

Furthermore, the present invention has a sixth characteristic that there are provided steps of adsorbing a die from a wafer with a bonding head, adjusting a position of the die at predetermined accuracy by a first adjustment mechanism, adjusting the position of the die at higher accuracy than the first adjustment mechanism by a second adjustment mechanism, positioning the bonding head and bonding the die to a substrate by the bonding head.

According to the present invention, a reliable die bonder that can accurately bond the die and a semiconductor manufacturing method can be provided.

DETAILED DESCRIPTION OF THE PREFERRED EMBODIMENTS

Figure 1:
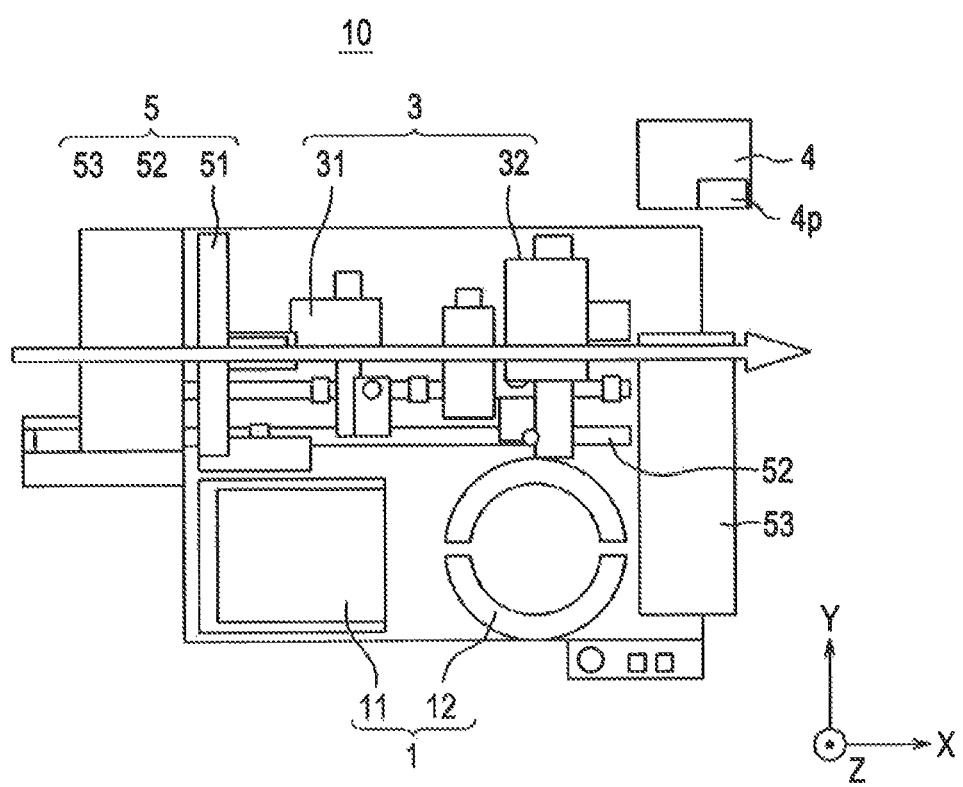
FIG. 1 is a schematic top view showing a die bonder in one embodiment of the present invention.

Referring to the drawings, an embodiment will be described below.

FIG. 1 is a schematic top view showing a die bonder 10 in one embodiment of the present invention. The die bonder 10 is roughly provided with a wafer feeder 1, a substrate feeding/carrying unit 5, a die bonding unit 3 and a control unit 4 that controls these units.

The wafer feeder 1 is provided with a wafer cassette lifter 11 and a pickup 12. The wafer cassette lifter 11 is provided with a wafer cassette (not shown) filled with wafer rings and sequentially feeds a wafer ring to the pickup 12. The pickup 12 moves the wafer ring to enable picking up a desired die from the wafer ring.

The substrate feeding/carrying unit 5 is provided with a stack loader 51, a frame feeder 52 and an unloader 53. The stack loader 51 feeds a substrate (for example, a lead frame) to which a die is bonded to the frame feeder 52. The frame feeder 52 carries the substrate to the unloader 53 via two processing positions on the frame feeder 52. The unloader 53 stores the carried substrate.

The die bonding unit 3 is provided with a preforming device 31 and a bonding head device 32. The preforming device 31 applies a die adhesive to the substrate carried by the frame feeder 52. The bonding head device 32 picks up a die from the pickup 12 and is lifted so as to move the die to a bonding point on the frame feeder 52. The bonding head device 32 lowers the die at the bonding point and bonds the die onto the substrate to which the die adhesive is applied.

Figure 2:
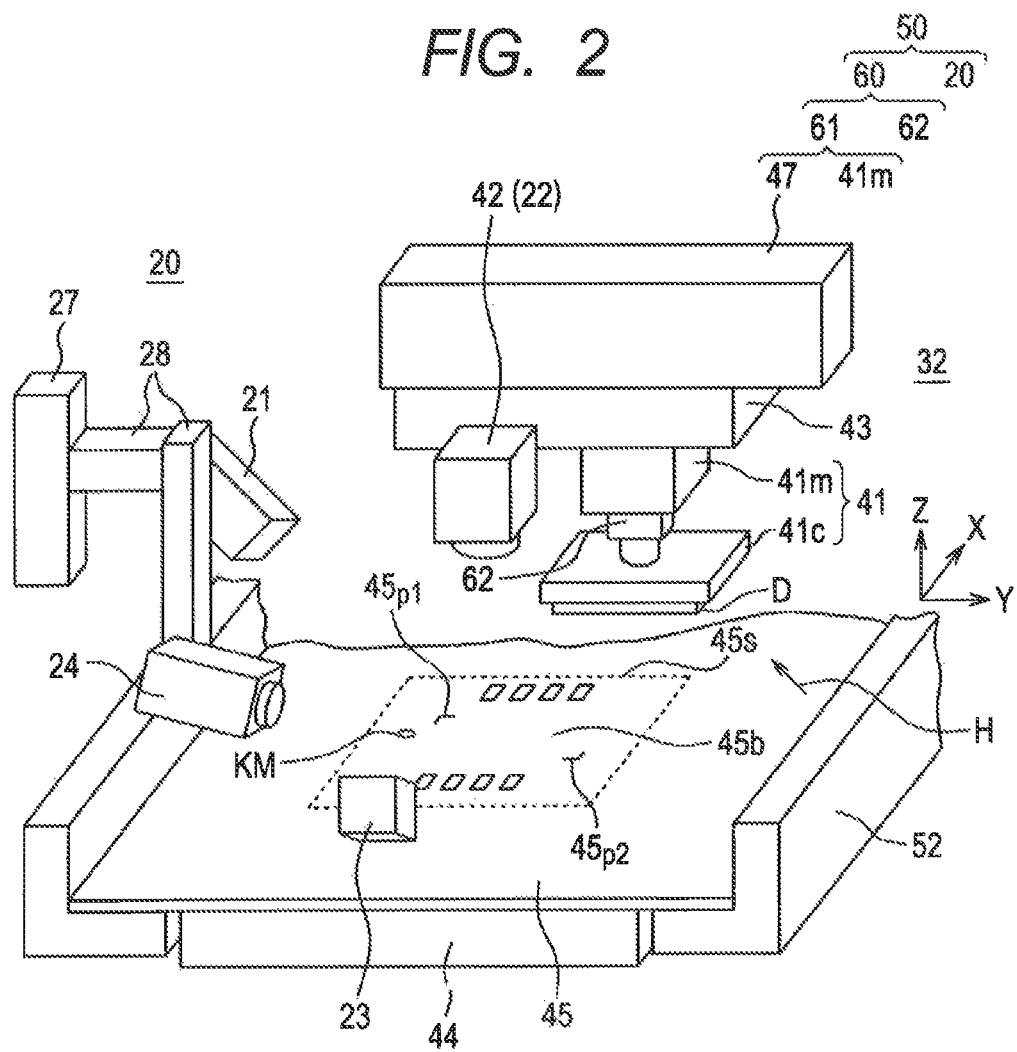
FIG. 2 is a schematic diagram showing an embodiment of a bonding head unit provided with a bonding position correcting device having a characteristic of the present invention.

FIG. 2 is a schematic diagram showing an embodiment of the bonding head device 32 provided with a bonding position correcting device 50 having a characteristic of the present invention. The bonding position correcting device 50 is roughly provided with a misregistration detector 20 that detects an amount of the misregistration of bonding, a mechanism 60 for positioning a bonding head 41 and a positioning controller 4$p$ located inside the control unit 4 that controls the positioning mechanism 60 based upon data and others from the misregistration detector 20.

The bonding head device 32 is provided with the bonding head 41 that adsorbs, and holds a die D with a collet 41$c$ at its end and bonds the die, a substrate position detection camera 42 (hereinafter merely called a position detection camera) that detects a position of a lead frame so as to position the lead frame 45 which is a substrate, a fixing table 43 that supports or fixes the bonding head 41 and the position detection camera 42, a moving mechanism 47 that moves the fixing table 43 in directions of the X-axis and the Y-axis and a bonding stage (hereinafter merely called a stage) 44 that holds the lead frame 45 in addition to the bonding position correcting device 50 described later. A reference numeral 52 denotes the frame feeder forming the substrate feeding/carrying unit 5 that carries the lead frame 45.

The positioning mechanism 60 is provided with a three-dimensional coarse adjustment mechanism 61 configured by a two-dimensional coarse adjustment movement mechanism 41$m$ that forms the bonding head 41, lifts and lowers the collet 41$c$ in a direction of the Z-axis and moves the collet 41$c$ in the direction of the Y-axis according to the fixing table 43 and the above-mentioned moving mechanism 47 and a fine adjustment mechanism 62 shown in FIG. 3. The positioning mechanism 60 coarsely or finely adjusts a position of the bonding head 41 (the collet 41$c$) based upon an amount of misregistration acquired by the misregistration detector 20 described later. The accuracy of the three-dimensional coarse adjustment mechanism 61 is 10 μm in relation with bonding speed when the three-dimensional coarse adjustment mechanism is configured by a motor, a ball screw (not shown) and others for example. Accordingly, as for the partial charge of coarse adjustment and fine adjustment, the three-dimensional coarse adjustment mechanism 61 takes charge of adjustment equal to or exceeding 10 μm and the fine adjustment mechanism 62 takes charge of adjustment below 10 μm and up to a few μm.

In the above-mentioned embodiment, a degree of freedom of the three-dimensional coarse adjustment mechanism is shared between the fixing table 43 and the bonding head 41. However, all the degree of freedom may also be conferred on the fixing table 43 or the bonding head 41.

Figure 3A:
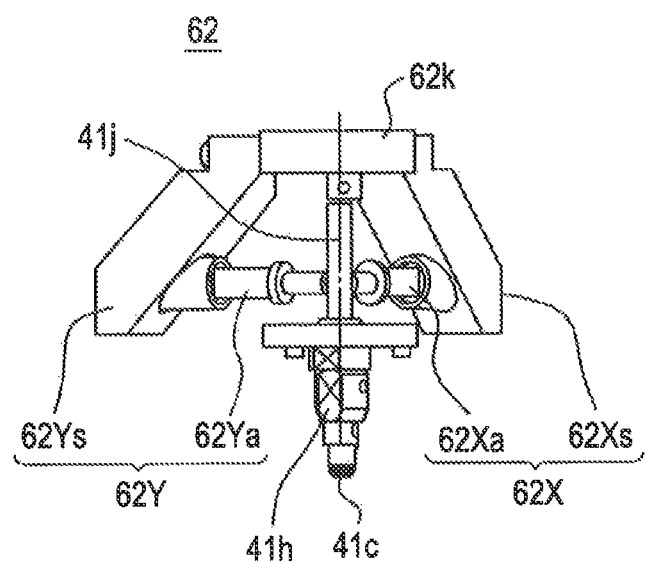
FIGS. 3A and 3B are a single view drawing and a top view respectively showing a first embodiment of a fine adjustment mechanism in this embodiment.
Figure 3B:
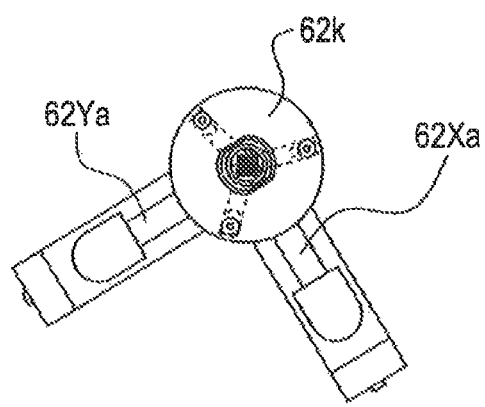

FIGS. 3A and 3B show a first embodiment of the fine adjustment mechanism 62 in this embodiment. FIG. 3A is a single view drawing when the fine adjustment mechanism 62 shown in FIG. 2 is viewed from a direction shown by an arrow H (see FIG. 2) of approximately 45 degrees from the Y-axis and FIG. 3B is a top view. The fine adjustment mechanism 62 is provided with an X-axis fine adjustment mechanism 62X that finely adjusts a position in the direction of the X-axis of the collet 41$c$ (the bonding head 41) by pressing a shaft 41$j$ at the end of the bonding head 41 in parallel with the X-axis and a Y-axis fine adjustment mechanism 62Y that finely adjusts a position in the direction of the Y-axis of the collet 41$c$ by pressing the shaft 41$j$ at the end in parallel with the Y-axis. A reference numeral 41$h$ denotes a collet holding part provided to an end of the shaft at the end 41$j$.

The X-axis fine adjustment mechanism 62X and the Y-axis fine adjustment mechanism 62Y are provided with each actuator part 62Xa, 62Ya equipped with an actuator and each supporting rod 62Xs, 62Ys that supports each actuator part. Further, the X-axis fine adjustment mechanism 62X and the Y-axis fine adjustment mechanism 62Y are adjustably attached to a fine adjustment mechanism fixture 62$k$ that adjustably fixes the fine adjustment mechanism 62 to the three-dimensional coarse adjustment movement mechanism 61. In this embodiment, a piezo-electric device is used for the actuator and fine adjustment to a desired position is made by applying voltage corresponding to a required amount of displacement. For the actuator, an ultra-magnetostrictive device and others are conceivable in addition to the piezo-electric device.

In the first embodiment of the fine adjustment mechanism 62, since adjusted directions of the X-axis and the Y-axis are parallel to a bonding face, the fine adjustment mechanism has an advantage that the attachment is easy and the adjustment is also easy.

Next, referring to FIG. 2 again, the misregistration detector 20 will be described. The misregistration detector 20 is provided with a reference mark forming light source (hereinafter merely called a light source) 21 that forms a reference mark KM showing a reference position on the lead frame 45, a processing position camera 22 that images the reference mark KM and a bonding position (hereinafter called a processing position) 45$b$ before the collet 41$c$ is lowered, and two position correction imaging cameras (hereinafter merely called position correction cameras) 23, 24 that image an end of the bonding head 41 over the processing position 45$b$ and the reference mark KM when the collet 41$c$ is lowered. In this embodiment, the substrate position detection camera 42 also functions as the processing position camera 22. Further, any light source may also be used for the right source 21 as long as the light source enables spotlighting like a laser. Further, the processing position camera 22 and others that form the misregistration detector 20 are fixed to a structural member 27 of the die bonder 10 via supports 28. In FIG. 2, a support 28 of the position correction camera 23 is omitted for a satisfactory view. A reference numeral 45$s$ shown by a broken line denotes a processing position circumferential area including the processing position 45$b$ and the reference mark KM. In the processing position 45$b$, two L-type recognition patterns 45$p$1, 45$p$2 are formed on a diagonal line of the die D.

Figure 4A:
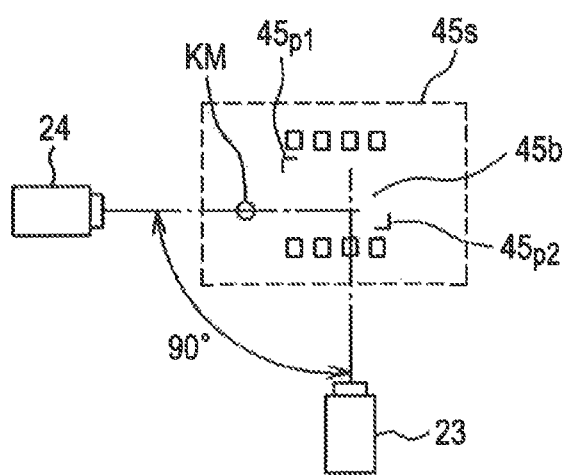
FIGS. 4A and 4B are a top view and a side view showing the arrangement of two position correction cameras in this embodiment.
Figure 4B:
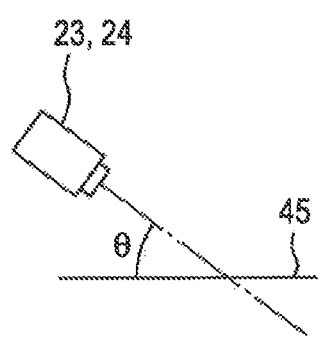

FIGS. 4A and 4B show the arrangement of the two position correction cameras 23, 24. FIG. 4A is a top view showing the two position correction cameras 23, 24. FIG. 4B is a side view showing the position correction camera 23 or 24. As shown in FIG. 4A, the two position correction cameras 23, 24 are mutually perpendicularly arranged. Further, as shown in FIG. 4B, the two position correction cameras 23, 24 image the processing position circumferential area 45$s$ including at least the reference mark KM and the processing position 45$b$ from a diagonal direction of an angle θ with the lead frame 45.

Figure 5:
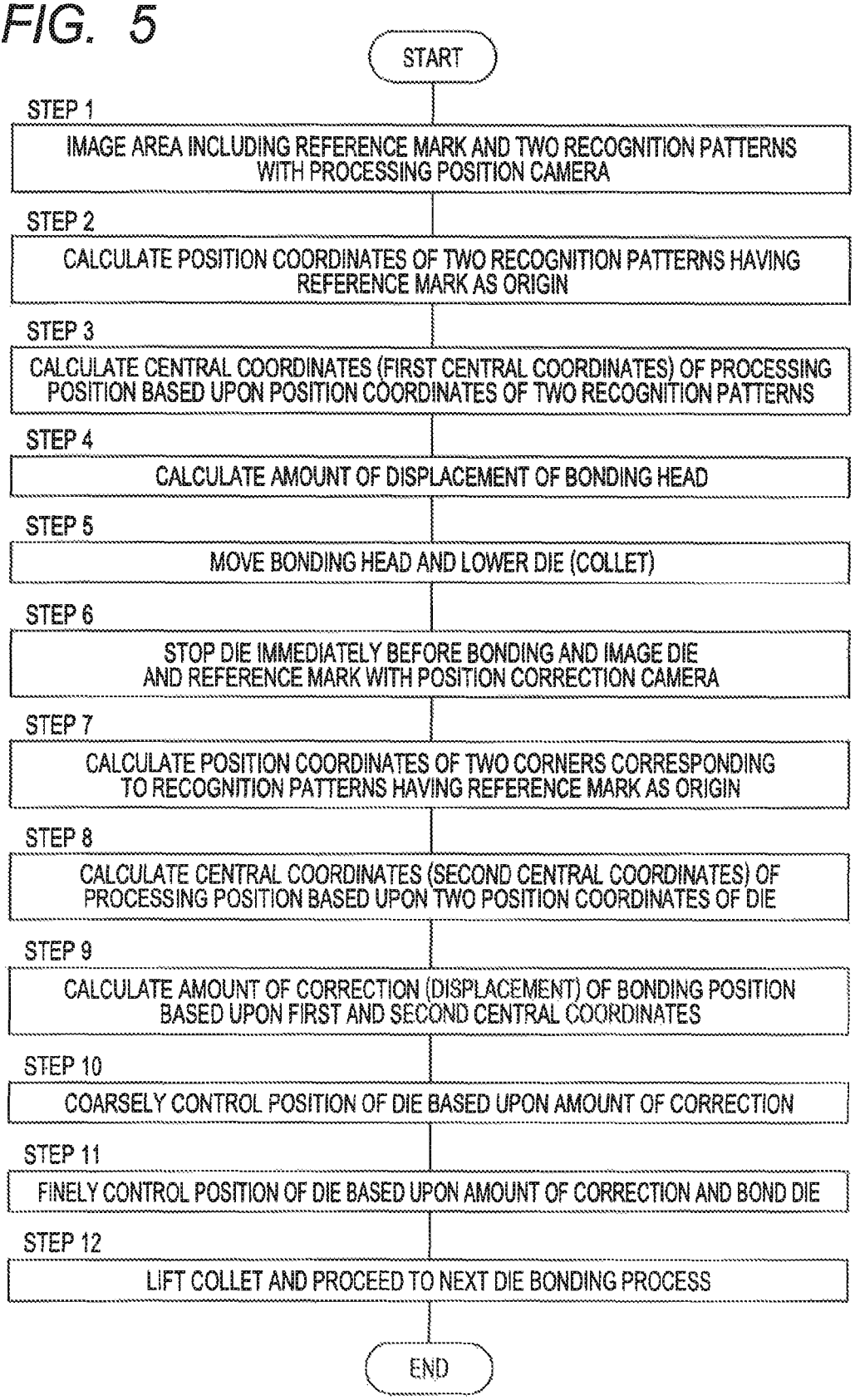
FIG. 5 shows a process flow from the moment when a bonding head adsorbs a die and is located on the upside of a bonding position.
Figure 6A:
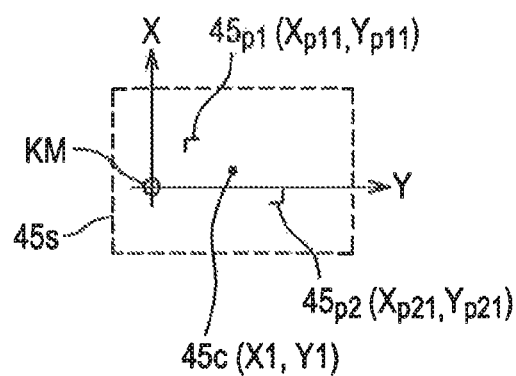
FIGS. 6A, 6B and 6C show imaged screens in the process flow in FIG. 5.
Figure 6B:
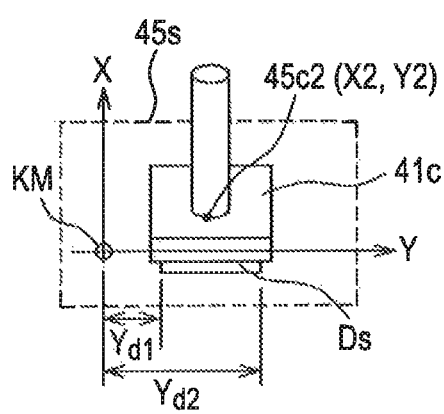
Figure 6C:
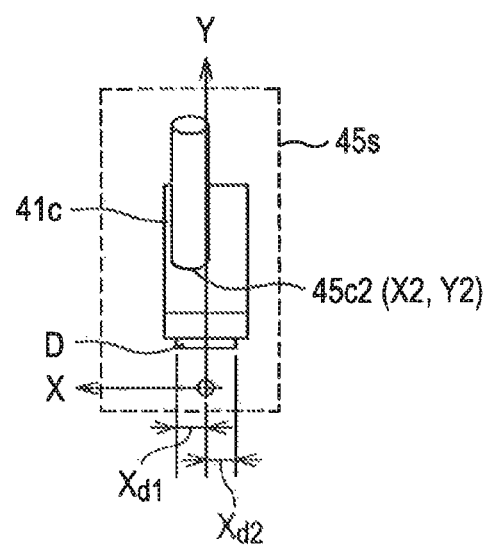

Referring to FIG. 5, FIGS. 6A, 6B and 6C, a bonding process flow which is a characteristic of the present invention in the embodiment shown in FIG. 2 will be described based upon the above-mentioned configuration. FIG. 5 shows the process flow since the bonding head 41 adsorbs the die and is located on the upside of the processing position. FIGS. 6A, 6B and 6C show screens imaged in the flow shown in FIG. 5.

First, before the bonding head 41 is lowered up to the processing position 45b together with the die D, the processing position circumferential area 45s including the reference mark KM and the processing position 45b is imaged with the processing position camera 22 (a step 1). FIG. 6A is the imaged screen showing this state. In the state shown in FIG. 6A, the lead frame is thermally expanded by heating. Accordingly, position coordinates of the processing position 45b acquired from FIG. 6A include the effect of thermal expansion.

In the processing position 45b, the two L-type recognition patterns 45p1, 45p2 are formed on the diagonal line of the die D. Position coordinates of the two recognition patterns 45p1, 45p2 are calculated using the center of the reference mark KM as an origin in image processing (a step 2). Next, position coordinates of a central position 45c of the processing position 45b are calculated based upon the position coordinates of the two recognition patterns 45p1, 45p2 (a step 3). The coordinates of the central position 45c is called first central coordinates. When the first central coordinates 45c1 and the position coordinates of the two recognition patterns 45p1, 45p2 are (X1, Y1), (Xp11, Yp11) and (Xp21, Yp21) in order, the first central coordinates are acquired according to the following expressions (1) and (2):

$$X1=(Xp11+Xp21)/2 \quad (1)$$

$$Y1=(Yp11+Yp21)/2 \quad (2)$$

Next, an amount of the displacement of the bonding head 41 is calculated (a step 4). The position coordinates in the expressions (1) and (2) are equivalent to those viewed from the processing position camera 22. As the bonding head 41 and the processing position camera 22 are set off, the position coordinates in the expressions are required to be varied to position coordinates viewed from the bonding head 41. Then, when offset amounts are (Xh, Yh), position coordinates (Xhi, Yhi) of the central position 45c viewed from the bonding head 41 are acquired according to the following expressions (3) and (4):

$$Xhi=X1+Xh \quad (3)$$

$$Yhi=Y1+Yh \quad (4)$$

Next, the bonding head 41 is moved in a position shown by the expressions (3) and (4) and the collet 41c that holds the die D is lowered toward the processing position 45b (a step 5). The transit time of the bonding head 41 and time when the die D is lowered are very short. Therefore, in the meantime, the contour of the lead frame 45 is hardly changed by thermal expansion and an offset amount hardly varies. Accordingly, when there is no variation from an initial value of the offset amount or there is no variation in time sequence, the die D can be bonded to the processing position 45b which is a desired value by lowering the die D.

Actually, however, the offset amount varies because of radiant heat and others by a heating mechanism of the lead frame 45. Then, the variation of the offset amount is corrected. Therefore, the lowering of the die is stopped immediately before bonding and displacement between a position in which the die is lowered and the processing position 45 is detected. First, in a stopped state, the processing position circumferential area 45s including the reference mark KM and the processing position 45b is imaged by the two position correction cameras 23, 24 (a step 6).

FIGS. 6B and 6C show states imaged by the position correction cameras 23, 24. The first reason why the processing position camera 22 for overhead imaging is not used is that the collet 41c hides the processing position 45b and the recognition patterns 45p1, 45p2 cannot be recognized. The second reason is that in FIG. 2, the collet 41c seems to be able to be imaged, but actually the collet 41c cannot be viewed from the upside due to the mechanism of the bonding head 41. Then, the die D or the collet 41c is imaged at the angle θ shown in FIG. 4B. Since actually the die D is bonded, an angle at which the die itself can be imaged is desirable. When the die itself is imaged, the angle is apt to be small. However, since the deformation of an image increases and position detection accuracy is deteriorated when the angle θ is too reduced, the angle is adjusted to be suitable.

Next, in the stopped state, position coordinates of corners of the die D corresponding to the two recognition marks are calculated in image processing (a step 7). In the first embodiment, the two position correction cameras 23, 24 are used to acquire the position coordinates of the corners of the die D. The reason is as follows. When the die is imaged from a diagonal direction, the length per one pixel is different depending upon a position in the respective directions of the X-axis and the Y-axis viewed from the position correction cameras 23, 24. However, the directions of the Y-axis and the X-axis are unchanged. Then, as shown in FIG. 6B, position coordinates in the direction of the X-axis of the die D are detected in a coordinate system with the center of the reference mark KM as a reference based upon data imaged by the position correction camera 23, and as shown in FIG. 6C, position coordinates in the direction of the Y-axis of the die D are detected in the coordinate system with the center of the reference mark KM as the reference based upon data imaged by the position correction camera 24. Accordingly, in the embodiment shown in FIG. 2, the die D can be detected at each corner on the imaging side corresponding to the recognition patterns 45p1, 45p2.

The coordinates of the central position of the die D, that is, the central position 45c of the processing position 45b are calculated based upon the position coordinates of the corners of the die D (a step 8). The central coordinates are called second central coordinates 45c2. The second central coordinates 45c2 (X2, Y2) are acquired according to the following expressions (5) and (6) based upon FIGS. 6B and 6C:

$$X2=(Xd1+Xd2)/2 \quad (5)$$

$$Y2=(Yd1+Yd2)/2 \quad (6)$$

Next, amounts of the displacement (amounts to be corrected) (ΔX, ΔY) of the bonding position shown in the following expressions (7) and (8) are calculated based upon the first central coordinates acquired according to the expressions (1) and (2) and the second central coordinates acquired according to the following expressions (5) and (6) (a step 9):

$$\Delta X=X2-X1 \quad (7)$$

$$\Delta Y=Y2-Y1 \quad (8)$$

Next, the amounts of the displacement are first coarsely adjusted up to approximately 10 μm by the three-dimensional coarse adjustment mechanism 61 (a step 10), the residual amounts of the displacement in units of one-digit μm are finely adjusted up to a few μm by the fine adjustment mechanism 62, and the die is bonded to the lead frame (the substrate) 45 (a step 11).

Finally, the collet 41c is lifted and the current die bonding process proceeds to the next die bonding process (a step 12).

As the amounts of the displacement acquired according to the expressions (7) and (8) are those viewed from the bonding head 41, the following two points can be given as a cause. For the first point, the amounts of the displacement are equivalent to those of the offset amounts due to radiant heat between the bonding head 41 and the processing position camera 22 as described above. For the second point, the amounts of the displacement are equivalent to those of the offset amounts due to radiant heat between the bonding head 41 and each position correction camera 23, 24. However, in the second cause, since the position coordinates are calculated with the reference mark as the origin in the same image, the displacement of the offset amounts is corrected of itself. Accordingly, the first point should be considered as the cause.

As described above, for the recognition patterns, the two L-type recognition patterns 45$p$1, 45$p$2 provided on the diagonal line of the processing position 45$b$ are used. Since amounts of correction in the central position 45$c$ of the processing position, that is, the bonding position are finally calculated as described above, the L-type recognition patterns 45$p$1, 45$p$2 are virtually considered and only one recognition pattern such as a letter x may also be provided to the central position 45$c$ of the processing position.

According to the embodiments described above, both the variation by the thermal expansion of the lead frame 45 itself because of the high temperature of the lead frame 45 and the variation of the offset amounts between the bonding head 41 and the processing position camera 22 or each position correction camera 23, 24 can be corrected and the reliable die bonder that can accurately bond the die can be provided.

Further, according to the embodiments described above, the bonding accuracy of a few μm can be acquired by using the fine adjustment mechanism provided with the piezo-electric device and the ultra-magnetostrictive device for the actuator.

As a result, a reliable semiconductor manufacturing method can be provided by using this die bonder.

Next, referring to FIGS. 6 and 7, another embodiment of the mine adjustment mechanism 62 will be described. The same reference numeral is allocated to a part having the same function in another embodiment.

Figure 7:
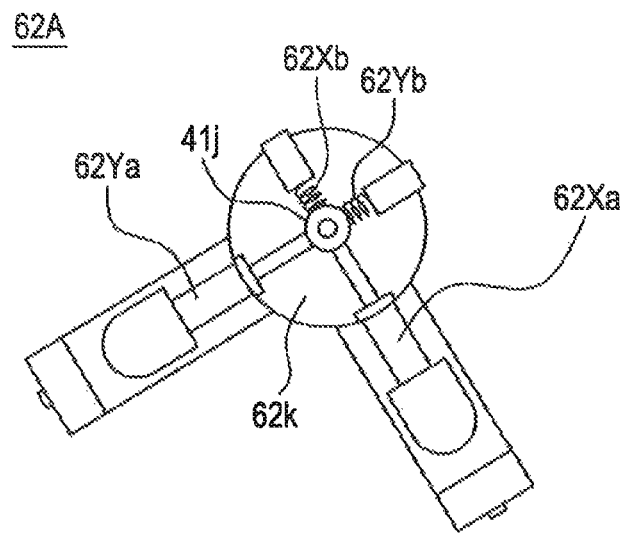
FIG. 7 shows a second embodiment of the fine adjustment mechanism in this embodiment.

FIG. 7 shows a second embodiment in which springs 62Xb, 62Yb are arranged on the reverse sides of the shaft 41$j$ at the end pressed by the actuator parts 62Xa, 62Ya in the first embodiment shown in FIGS. 3A and 3B. Normally, a piezo-electric device generates force in extension. However, it has no tensile force (no restoring force) in restoration. Accordingly, in a fine adjustment mechanism 62A in the second embodiment, a spring property is given to a shaft 41$j$ at the end and when a piezo-electric device is contracted, it is restored by the shaft 41$j$ at the end itself. For the spring property, elastic bodies may also be used in place of the springs 62Xb, 62Yb. In place of the spring property, the same mechanisms as actuator parts 62Xa, 62Ya are provided on the reverse sides of the actuator parts 62Xa, 62Ya and may also be moved in both directions of the X-axis and the Y-axis with a pair.

As an ultra-magnetostrictive device can bidirectionally displace when the ultra-magnetostrictive device is used for the actuator, the ultra-magnetostrictive device can restore or can displace in a new direction by changing a displaced direction.

According to the second embodiment, a bonding position can be further securely finely adjusted and the bonding accuracy of a few μm can be acquired. As a result, a reliable semiconductor manufacturing method can be provided by using this die bonder.

Figure 8:
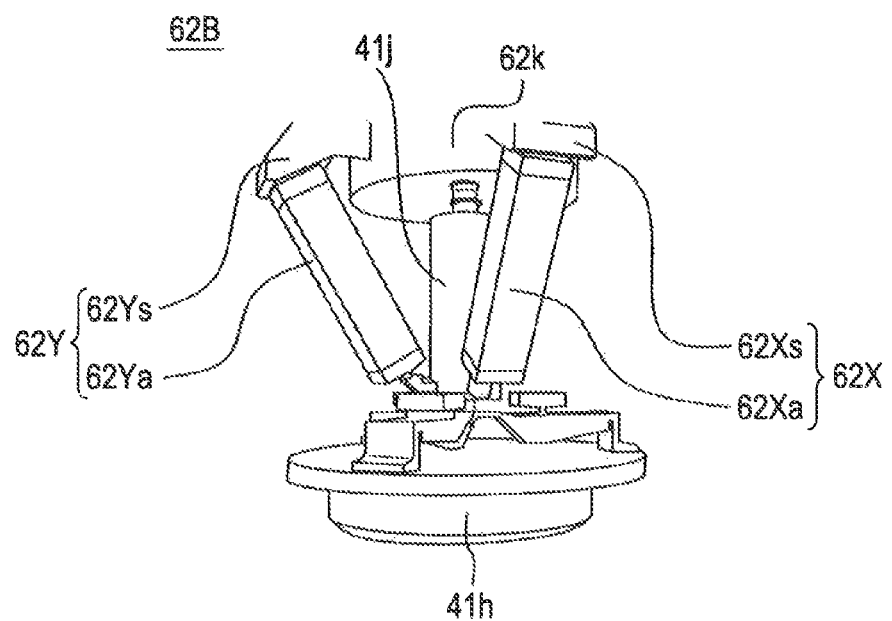
FIG. 8 shows a third embodiment of the fine adjustment mechanism in this embodiment.

Though the actuator parts 62Xa, 62Ya are arranged in parallel with the bonding face in the first embodiment, actuator parts 62Xa, 62Ya are diagonally arranged in a third embodiment shown in FIG. 8. In a fine adjustment mechanism 62B in the third embodiment, since each horizontal overhang of the actuator parts 62Xa, 62Ya is inhibited, a bonding head 41 can be miniaturized.

In the third embodiment, a bonding position can also be securely finely adjusted and the bonding accuracy of a few μm can be acquired. As a result, a reliable semiconductor manufacturing method can be provided by using this die bonder.

In the above-mentioned fine adjustment mechanisms 62, 62A, 62B, the two actuators are provided to displace in the directions of the X-axis and the Y-axis. However, three or more actuators may also be arranged mutually apart by 120 degrees or 90 degrees for example to make them act upon the shaft 41$j$ at the end.

In the above-mentioned embodiments, for a cause that obstructs high-accuracy bonding, the displacement due to high temperature or radiant heat of the component is described for the example. However, the fine adjustment mechanism according to the present invention can be applied to the high-accuracy positioning of bonding for finely adjusting the displacement, regardless of the cause of the displacement.

The embodiments of the present invention have been described. However, the present invention includes various alternative examples, modifications or transformations in a range which does not deviate from its object.

What is claimed is:

1. A die bonder, comprising:
a bonding head that adsorbs a die from a wafer and bonds it to a substrate;
a first adjustment mechanism that positions the bonding head in order to position a position of the die at predetermined accuracy;
a second adjustment mechanism that is provided to the bonding head, and adjusts the position of the die at higher accuracy than the first adjustment mechanism;
a positioning controller that controls the first adjustment mechanism and the second adjustment mechanism;
a reference mark provided to a substrate or in the vicinity of the substrate;
a first imaging means that images the reference mark and a recognition pattern provided to a bonding position of the substrate;
a second imaging means that images the reference mark and the die brought close to the bonding position; and
a misregistration detector provided with a correcting means that corrects a position of the die brought close to the bonding position based upon imaged data acquired by the first and second imaging means.

2. The die bonder according to claim 1, wherein the second adjustment mechanism is provided with an actuator that acts upon a shaft at an end of the bonding head from a plurality of directions and displaces the bonding head by a predetermined quantity.

3. The die bonder according to claim 2, wherein the actuator is one of a piezo-electric device and an ultra-magnetostrictive device.

4. The die bonder according to claim 2, comprising a restoring force means that generates restoring force for restoring the displacement of the predetermined quantity from directions opposite to the plurality of directions.

5. The die bonder according to claim 1, wherein the recognition pattern is provided to a predetermined position so that a center position of the recognition pattern matches the center position of the tip portion of the bonding head when the die is mounted on the substrate, and the misregistration detector obtains the center position of the recognition pattern as the origin at the center point of the reference mark from the imaging result of the first imaging means, obtains the center position of the tip portion as the origin at the center point of the reference mark from the imaging result of the second imaging means, and detects misregistration of the tip portion as the difference between the center position of the tip portion and the center position of the recognition pattern.

6. The die bonder according to claim 5, wherein the predetermined position provided with the recognition pattern is the location of a line corresponding to a diagonal of the tip portion.

7. The die bonder according to claim 1, wherein the tip portion is the die adsorbed to the bonding head or a collet for holding the die.

8. The die bonder according to claim 5, wherein the tip portion is the die adsorbed to the bonding head or a collet for holding the die.

9. The die bonder according to claim 1, wherein the reference mark is formed by a light source that can irradiate spots.

10. The die bonder according to claim 5, wherein the reference mark is formed by a light source that can irradiate the spots.

11. The die bonder according to claim 1, wherein the first imaging means serves in a third imaging means imaging the substrate for alignment of the substrate.

12. The die bonder according to claim 5, wherein the first imaging means serves in a third imaging means imaging the substrate for alignment of the substrate.

* * * * *